US009159436B2

(12) United States Patent
 Kim (10) Patent No.: US 9,159,436 B2
(45) Date of Patent: Oct. 13, 2015

(54) READING METHOD OF NON-VOLATILE MEMORY DEVICE

(75) Inventor: Do-Young Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 55 days.

(21) Appl. No.: 13/620,466

(22) Filed: Sep. 14, 2012

(65) Prior Publication Data
US 2013/0163339 A1      Jun. 27, 2013

(30) Foreign Application Priority Data

Dec. 21, 2011 (KR) .................. 10-2011-0139633

(51) Int. Cl.
 *G11C 16/26* (2006.01)
 *G11C 16/24* (2006.01)
 *G11C 16/34* (2006.01)

(52) U.S. Cl.
 CPC .............. *G11C 16/26* (2013.01); *G11C 16/24* (2013.01); *G11C 16/3418* (2013.01)

(58) Field of Classification Search
 CPC .... G11C 16/0483; G11C 16/10; G11C 16/30; G11C 16/12
 USPC ................ 365/180, 185.21, 185.18
 See application file for complete search history.

(56) References Cited

U.S. PATENT DOCUMENTS

| 7,898,864 B2* | 3/2011 | Dong ................. 365/185.19 |
| 2010/0034021 A1* | 2/2010 | Joo ................. 365/185.11 |
| 2012/0120727 A1* | 5/2012 | Kim et al. ................. 365/185.17 |

FOREIGN PATENT DOCUMENTS

| KR | 1020090026117 | 3/2009 |
| KR | 1020100087806 | 8/2010 |

* cited by examiner

*Primary Examiner* — Shawki S Ismail
*Assistant Examiner* — Muhammad S Islam
(74) *Attorney, Agent, or Firm* — IP & T Group LLP (57) ABSTRACT

A non-volatile memory device includes a first selection transistor, a second selection transistor, and a plurality of memory cells serially coupled between the first selection transistor and the second selection transistor. A reading method of the non-volatile memory device includes applying a read voltage to a gate of a selected memory cell; applying a first pass voltage to a gate of a memory cell adjacent to the selected memory cell, and applying a second pass voltage to gates of the other memory cells, wherein the selected memory cell is in one program state among first to $T^{th}$ program states in a direction that threshold voltage is increased, where T is a natural number greater than 2, and the first pass voltage is decreased as the selected memory cell goes toward the $T^{th}$ program state.

6 Claims, 6 Drawing Sheets

| | | PRIOR ART | PRESENT INVENTION |
|---|---|---|---|
| $MC_n$:P1 | $V_{PASS1}$ | 8.5 | 7.5+A1 |
| | $V_{PASS2}$ | 7.5 | 7.5 |
| $MC_n$:P2 | $V_{PASS1}$ | 8.5 | 7.5+A2 |
| | $V_{PASS2}$ | 7.5 | 7.5 |
| $MC_n$:P3 | $V_{PASS1}$ | 8.5 | 7.5+A3 |
| | $V_{PASS2}$ | 7.5 | 7.5 |

| | $V_{PASS1}$ | | | | | |
|---|---|---|---|---|---|---|
| | $MC_n$:P1 | | $MC_n$:P2 | | $MC_n$:P3 | |
| | A1 | 7.5+A1 | A2 | 7.5+A2 | A3 | 7.5+A3 |
| PRIOR ART | 1.0 | 8.5 | 1.0 | 8.5 | 1.0 | 8.5 |
| EXAMPLE 1 | 1.5 | 9.0 | 1.0 | 8.5 | 0.0 | 7.5 |
| EXAMPLE 2 | 1.7 | 9.2 | 1.1 | 8.6 | 0.0 | 7.5 |
| EXAMPLE 3 | 1.9 | 9.4 | 1.2 | 8.7 | 0.0 | 7.5 |
| EXAMPLE 4 | 2.1 | 9.6 | 1.3 | 8.8 | 0.0 | 7.5 |
| EXAMPLE 5 | 1.5 | 9.0 | 1.0 | 8.5 | -0.3 | 7.2 |
| EXAMPLE 6 | 1.7 | 9.2 | 1.1 | 8.6 | -0.3 | 7.2 |
| EXAMPLE 7 | 1.9 | 9.4 | 1.2 | 8.7 | -0.3 | 7.2 |
| EXAMPLE 8 | 2.1 | 9.6 | 1.3 | 8.8 | -0.3 | 7.2 |
| EXAMPLE 9 | 1.5 | 9.0 | 1.0 | 8.5 | -0.5 | 7.0 |
| EXAMPLE 10 | 1.5 | 9.0 | 1.0 | 8.5 | -0.7 | 6.8 |
| EXAMPLE 11 | 1.5 | 9.0 | 1.0 | 8.5 | -1.0 | 6.5 |

FIG. 7

|  |  | $V_{PASS1}$ | | |
|---|---|---|---|---|
|  |  | $MC_n$:P1 | $MC_n$:P2 | $MC_n$:P3 |
|  |  | 7.5+A1 | 7.5+A2 | 7.5+A3 |
|  | Cycling / PRIOR ART | 8.5 | 8.5 | 8.5 |
| Set 1 | 0K | 8.50 | 8.50 | 8.50 |
| Set 2 | 0.5K | 8.60 | 8.55 | 8.53 |
| Set 3 | 1.0K | 8.70 | 8.60 | 8.56 |
| Set 4 | 1.5K | 8.80 | 8.65 | 8.59 |
| Set 5 | 2.0K | 8.90 | 8.70 | 8.62 |
| Set 6 | 2.5K | 9.00 | 8.75 | 8.65 |
| Set 7 | 3.0K | 9.10 | 8.80 | 8.68 |
|  | Δ | 0.1 | 0.05 | 0.03 |

FIG. 8

|  |  | $V_{PASS1}$ | | |  |
|---|---|---|---|---|---|
|  |  | $MC_n$:P1 | $MC_n$:P2 | $MC_n$:P3 |  |
|  |  | 7.5+A1 | 7.5+A2 | 7.5+A3 |  |
|  | Cycling / PRIOR ART | 8.5 | 8.5 | 8.5 |  |
| Set 1 | 0K | 8.25 | 8.25 | 8.25 | 0.97 |
| Set 2 | 0.5K | 8.34 | 8.29 | 8.27 | |
| Set 3 | 1.0K | 8.44 | 8.34 | 8.30 | |
| Set 4 | 1.5K | 8.80 | 8.65 | 8.59 | 1.00 |
| Set 5 | 2.0K | 8.90 | 8.70 | 8.62 | |
| Set 6 | 2.5K | 9.27 | 9.01 | 8.91 | 1.03 |
| Set 7 | 3.0K | 9.37 | 9.06 | 8.94 | |
|  | Δ | 0.1 | 0.05 | 0.03 | |

READING METHOD OF NON-VOLATILE MEMORY DEVICE

CROSS-REFERENCE TO RELATED APPLICATIONS

The present application claims priority of Korean Patent Application No. 10-2011-0139633, filed on Dec. 21, 2011, which is incorporated herein by reference in its entirety.

BACKGROUND

1. Field

Exemplary embodiments of the present invention relate to a method for operating a non-volatile memory device, and more particularly, to a reading method of a non-volatile memory device.

2. Description of the Related Art

Non-volatile memory device is capable of electrically performing program operation and erase operation without performing a refresh operation to reprogram data every predetermined cycle. Examples of such non-volatile memory devices include flash memory devices.

A non-volatile memory device generally includes plural memory cells, each having a stacked structure of a tunnel insulation layer, a floating gate, a dielectric layer, and a control gate. In the non-volatile memory device, a program operation and an erase operation are achieved by injecting or withdrawing electrons to or from a floating gate of a memory cell, through well-known Fowler-Nordheim (F-N) tunneling, and controlling a threshold voltage of the memory cell.

The non-volatile memory device has a problem of increasing a threshold voltage distribution width because the threshold voltage of the memory cell ascends as the number of erase/program operation cycles.

Such a concern is described in Korean Patent Publication No. 10-2010-0087806, which is referred to as Reference 1, hereafter. The Reference 1 provides one of solutions to reduce the above concerns.

The Reference 1 discloses a method including steps of applying a read voltage to the control gate of a selected memory cell, applying a relatively high pass voltage to the control gates of unselected memory cells adjacent to the selected memory cell, and applying a relatively low pass voltage to the control gates of the other unselected memory cells during a read operation. Furthermore, the Reference 1 discloses a method for producing a narrow the threshold voltage distribution width of a memory cell during a read operation despite the increasing number of cycles where the erase/program operation is performed.

As there is the growing level of the pass voltage applied to the control gate of the memory cell adjacent to the selected memory cell during the read operation, which is shown in the Reference 1, the vertical and horizontal electric fields applied to the selected memory cell increases. Accordingly, the floating gate of the selected memory cell might easily lose a lot of charges. The loss of charges grow worse, as more charges are captured in the floating gate of the selected memory cell and as the cycling is increased more.

In conclusion, limitation in the threshold voltage distribution width and prevention of the loss of charges in the read operation are in a trade-off relationship, and it may be difficult to reach both fulfilled conditions.

SUMMARY

An embodiment of the present invention is directed to a reading method of a non-volatile memory device that may improve the threshold voltage distribution width of a selected memory cell as well as preventing the loss of charges despite the increasing number of an erase/program operation cycles.

In accordance with an embodiment of the present invention, a reading method of a non-volatile memory device includes applying a read voltage to a gate of a selected memory cell; applying a first pass voltage to a gate of a memory cell adjacent to the selected memory cell; and applying a second pass voltage to gates of the other memory cells, wherein the selected memory cell is in a single program state of first to $T^{th}$ program states in a direction that threshold voltage is increased, where T is a natural number greater than 2, and the first pass voltage is decreased as the selected memory cell goes toward the $T^{th}$ program state.

In accordance with another embodiment of the present invention, a reading method of a non-volatile memory device includes applying a read voltage to a gate of a selected memory cell; applying a first pass voltage to a gate of a memory cell adjacent to the selected memory cell; and applying a second pass voltage to gates of the other memory cells, wherein the selected memory cell is in one program state among first to $T^{th}$ program states in a direction that threshold voltage is increased, where T is a natural number greater than 2, and the first pass voltage is increased as the number of cycles that an erase/program operation is performed is increased, and an incremental extent of the first pass voltage is decreased as the selected memory cell goes toward the $T^{th}$ program state.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
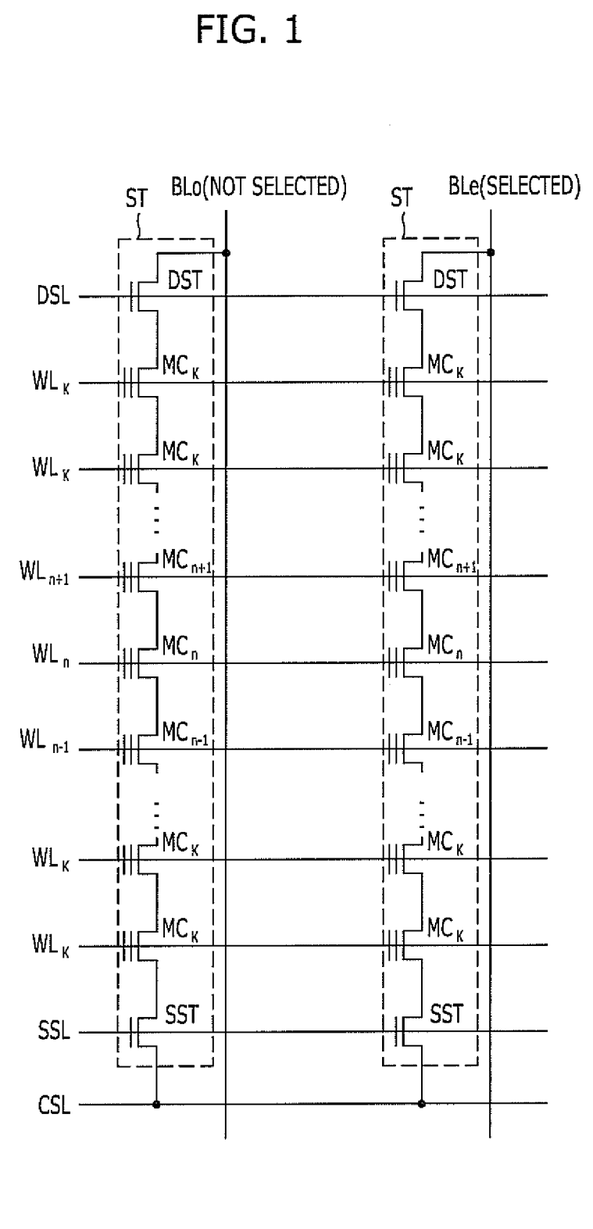
FIG. 1 is a circuit diagram illustrating a non-volatile memory device in accordance with an embodiment of the present invention.
Figure 2:
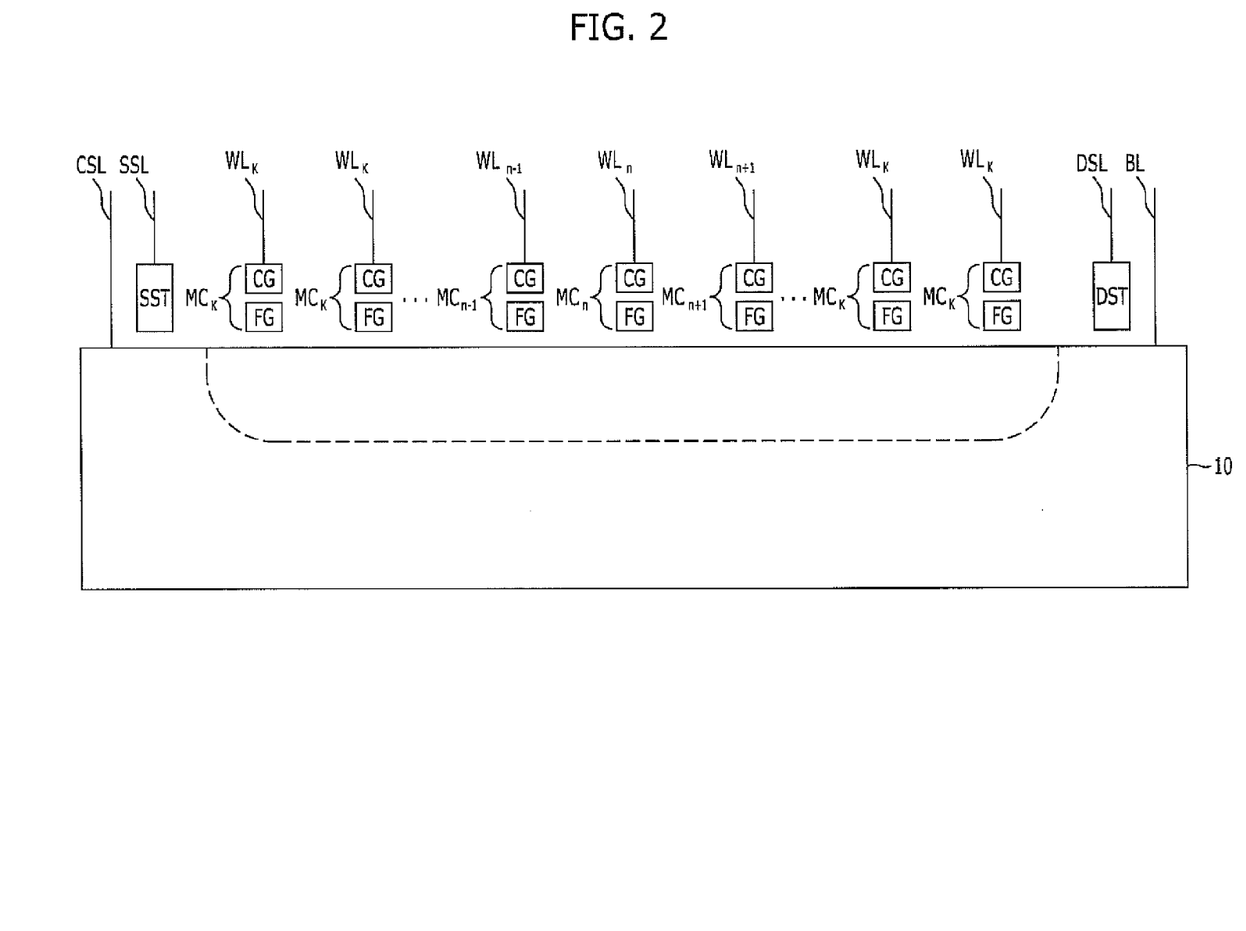
FIG. 2 illustrates a cross section of one string ST of FIG. 1.

FIG. 1 is a circuit diagram illustrating a non-volatile memory device in accordance with an embodiment of the present invention, and FIG. 2 illustrates a cross section of a string ST of FIG. 1.

Referring to FIGS. 1 and 2, a cell array of the non-volatile memory device includes a plurality of strings STs, a plurality of bit lines BLo and BLe respectively coupled with the one side of the string ST, and a common source line CSL coupled with the other side of the string ST in common. Although the embodiment of the present invention shows a device including two strings STs and two bit lines BLo and BLe, the scope of the present invention is not limited to it and the number of the strings and the number of the bit lines coupled with the strings, respectively, may be changed diversely. Also, the bit lines BLo and BLe may include plural odd bit lines BLos and plural even bit lines BLes which are arranged alternately. An odd page program/read operation in the memory cells coupled with the odd bit lines BLos may be independent of an even page program/read operation in the memory cells coupled with the even bit lines BLes.

Each of the strings STs includes a source selection transistor SST, a plurality of memory cells MC and a drain selection transistor DST, which are coupled in series.

Each of the memory cells MCs includes a stacked structure of a floating gate FG and a control gate CG. Each control gates CG in one string ST is respectively coupled with each in other strings STs to form a word line WL. Memory cells MCs sharing one word line WL are controlled by the word line WL.

The drain selection transistor DST controls the coupling between the corresponding string ST and the corresponding bit line BLo or BLe. The gates of the drain selection transistors DSTs in the strings STs are coupled with each other to form one drain selection line DSL.

The source selection transistor SST controls the coupling between the corresponding string ST and the common source line CSL. The gates of the source selection transistors SSTs in the strings STs are coupled with each other to form one source selection line SSL.

To easily describe the reading method, it is assumed that an even bit line BLe is a selected bit line, and a selected word line is denoted as $WL_n$, and unselected word lines adjacent to the selected word line $WL_n$ are denoted as $WL_{n+1}$ and $WL_{n-1}$, and the other unselected word lines are denoted as $WL_K$. A memory cell $MC_n$ which belongs to a strings ST coupled with the selected bit line BLe and is coupled with the selected word line $WL_n$ becomes targets for reading operation.

In the non-volatile memory device described above, each memory cell MC may be in an erase state or a program state as the erase/program operation is performed. In particular, a multi-level cell may be in any one of plural program states. This is described below with reference to FIG. 3.

Figure 3:
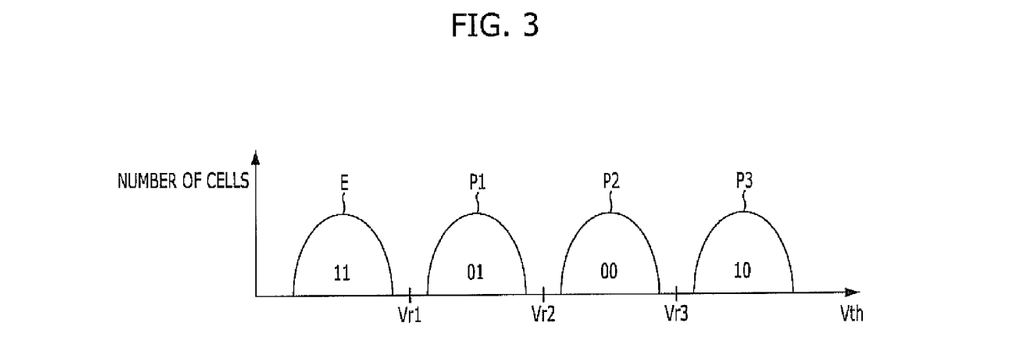
FIG. 3 is a graph showing a threshold voltage distribution of a memory cell in accordance with an embodiment of the present invention.

FIG. 3 is a graph showing a threshold voltage distribution of a memory cell in accordance with an embodiment of the present invention.

Referring to FIG. 3, each of the memory cells MC may have any state among an erase state E and first to third program states P1, P2 and P3. The memory cells MC of the erase state E may be set to have a negative threshold voltage distribution and have a data of '11'. The memory cells MC of the first program state P1 may be set to have a positive threshold voltage distribution and have a data of '01'. The memory cells MC of the second program state P2 may be set to have another positive threshold voltage distribution that is greater than the positive threshold voltage distribution of the first program state P1 and have a data of '00'. The memory cells MC of the third program state P3 may be set to have another positive threshold voltage distribution that is greater than the positive threshold voltage distribution of the second program state P2 and have a data of '10'. Accordingly, two-bit data such as '00', '01', '10' and '11' may be stored. As the threshold voltage of a programmed memory cell MC is higher, that is, it goes from the first program state P1 toward the third program state P3, the amount of charges stored in the floating gate FG of a memory cell MC becomes great.

To read the state of a read target memory cell $MC_n$ during a read operation, different voltages are applied in the erase state E or any one among the first to third program states P1, P2 and P3. A first read voltage Vr1 is applied to the control gate CG of the reading target memory cell $MC_n$ between the threshold voltage of the erase state E and the threshold voltage of the first program state P1. A second read voltage Vr2 is applied to the control gate CG of the reading target memory cell $MC_n$ between the threshold voltage of the first program state P1 and the threshold voltage of the second program state P2. A third read voltage Vr3 is applied to the control gate CG of the reading target memory cell $MC_n$ between the threshold voltage of the second program state P2 and the threshold voltage of the third program state P3.

Although this embodiment exemplarily illustrates each memory cell MC has any one of the erase state E and three program states P1, P2 and P3, the scope of the present invention is not limited to it. In another embodiment, each memory cell MC can have any one of the erase state E and first to $T^{th}$ program states, where T is a natural number greater than 2. It may be presumed that the threshold voltage increases as it goes from the erase state E to the $T^{th}$ program state. The threshold voltage distribution of each state does not overlap with that of another state.

Meanwhile, as described in the prior art, as the number of cycles that the erase/program operation is performed is increased, the threshold voltage distribution width of memory cells MC that are programmed into any one of the multiple program states. However, the incremental extent of the threshold voltage distribution width is different according the program state of a memory cell. This is experimentally confirmed as shown in FIG. 4.

Figure 4:
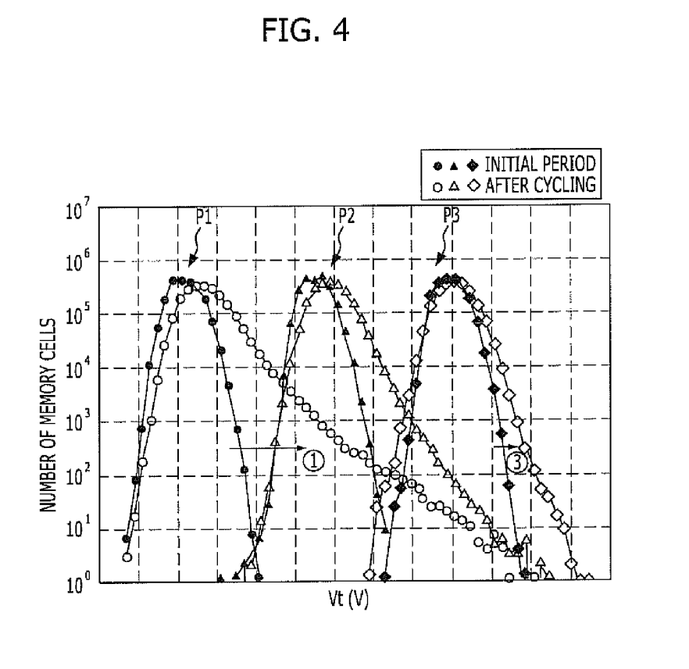
FIG. 4 is a graph showing variation of a threshold voltage distribution of memory cells according to the number of cycles that an erase/program operation is performed.

FIG. 4 is a graph showing variation of a threshold voltage distribution of memory cells according to the number of cycles that an erase/program operation is performed.

It may be seen from FIG. 4 that the width of threshold voltage distribution of the memory cells MC programmed to any one among the first to third program states P1, P2, and P3 is increased after the cycle of the erase/program operation performed in predetermined times, compared with the initial state.

Particularly, the incremental extent of the threshold voltage distribution width of memory cells MC that are programmed into the first program state P1 is greatest (refer to arrow 1̂). The incremental extent of the threshold voltage distribution width of memory cells MC that are programmed into the third program state P3 is smallest (refer to arrow 3̂).

Therefore, when each of the memory cells MC is programmed into any one among the first to $T^{th}$ program states, where T is a natural number greater than 2, in a direction that the threshold voltage increases, the incremental extent of the threshold voltage distribution width may be decreased as it goes toward the $T^{th}$ program state.

The Applicant of the present invention has paid attention to the experimental result shown in FIG. 4 and devised the reading method that may solve the problem of the trade-off relationship between the improvement in the threshold voltage distribution width and prevention of the loss of charges. According to the experimental result of FIG. 4, when each of the memory cells MC is programmed into any one program state among the first to $T^{th}$ program states, where T is a natural number greater than 2, in a direction that the threshold voltage increases, the memory cells MC programmed into the first program state have the greatest increase in the threshold voltage distribution width as the increasing number of the erase/program operation cycles, while having the smallest loss of charges at adjacent memory cells because the amount of charges captured in a floating gate is the smallest. Conversely, the memory cells MC programmed into the $T^{th}$ program state have the smallest increase in the threshold voltage distribution width as the increasing number of the erase/program operation cycles, while having the greatest loss of charges by the adjacent memory cells because the amount of charges captured in the floating gate is the greatest. In consideration of the characteristics, an embodiment of the invention can embody the following reading method, which is described below with reference to FIGS. 5, 6A and 6B.

Figure 5:
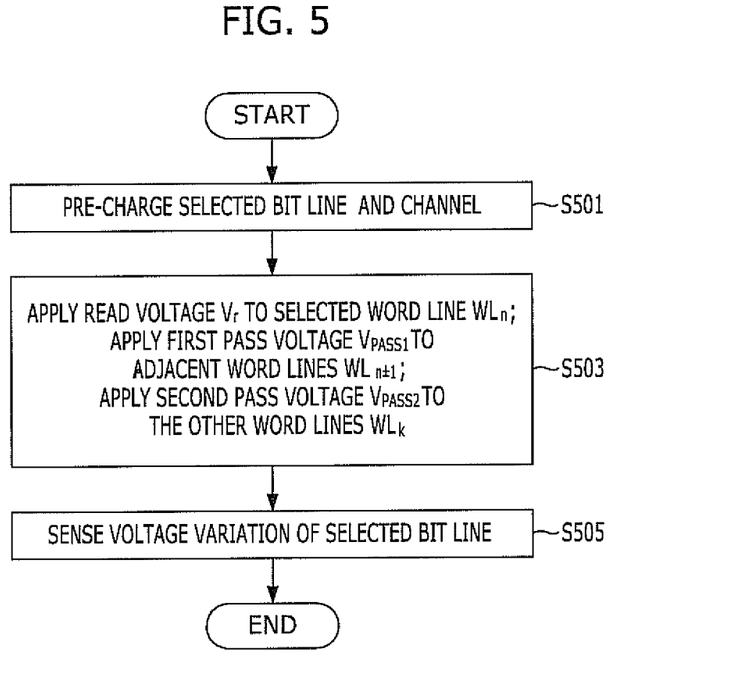
FIG. 5 is a flowchart describing a reading method of a non-volatile memory device in accordance with an embodiment of the present invention.

FIG. 5 is a flowchart describing a reading method of a non-volatile memory device in accordance with an embodiment of the present invention. The reading method is described by referring back to FIGS. 1 to 4 together.

Referring to FIG. 5, in step S501, the selected bit line BLe and the channel of a string ST coupled with the selected bit line BLe are pre-charged by applying a predetermined voltage, e.g., approximately 1V, to the selected bit line BLe and applying a voltage that may turn on the drain selection transistor DST, e.g., a power source voltage Vcc, to the drain selection line DSL.

Subsequently, in step S503, a read voltage Vr is applied to the selected word line $WL_n$; a first pass voltage $V_{PASS1}$ is applied to the word lines $WL_{n\pm1}$ adjacent to the selected word line $WL_n$; and a second pass voltage $V_{PASS2}$ is applied to the other word lines $WL_K$.

The read voltage Vr applied to the selected word line $WL_n$ is set to different levels according to the state of the read target memory cell $MC_n$. For example, as illustrated in FIG. 3, when the read target memory cell $MC_n$ is programmed into any one of the erase state E and the first to third program states P1, P2, and P3, any one of the first read voltage Vr1, the second read voltage Vr2, and the third read voltage Vr3 is applied to the selected word line $WL_n$. The first read voltage Vr1, the second read voltage Vr2, and the third read voltage Vr3 may be approximately 0V, 1.5V, and 3V, respectively, but the values may be changed differently. When the threshold voltage of the read target memory cell $MC_n$ is higher than the applied read voltage Vr, the read target memory cell $MC_n$ is in a turn-off state. On the other hand, when the threshold voltage of the read target memory cell $MC_n$ is lower than the applied read voltage Vr, the read target memory cell $MC_n$ is in a turn-on state.

The first pass voltage $V_{PASS1}$ and the second pass voltage $V_{PASS2}$ are voltages that turn on the memory cells $MC_{n\pm1}$, $MC_K$ coupled with unselected word lines $ML_{n\pm1}$ and $WL_K$. According to the conventional technology, whereas a typical turn-on voltage is used as the second pass voltage $V_{PASS2}$, the increase in the threshold voltage distribution width of the read target memory cell $MC_n$ is decreased by using a higher voltage than the second pass voltage $V_{PASS2}$ as the first pass voltage $V_{PASS1}$. However, as the first pass voltage $V_{PASS1}$ is increased, the threshold voltage distribution width of the read target memory cell $MC_n$ is improved whereas the loss of charges at the read target memory cell $MC_n$ is increased due to the influence of the adjacent memory cells $MC_{n\pm1}$.

Therefore, in the embodiment of the present invention, the level of the first pass voltage $V_{PASS1}$ is adjusted in consideration of the program state of the read target memory cell $MC_n$. For example, when the read target memory cell $MC_n$ is programmed into the first program state P1 in which the lowest threshold voltage is applied, the highest level of the first pass voltage $V_{PASS1}$ is used, considering that the increase in the threshold voltage distribution width according to the increasing number of erase/program operation cycles is the greatest and a small amount of charges loses at the adjacent memory cells $MC_{n\pm1}$. On the other hand, when the read target memory cell $MC_n$ is programmed into the third program state P3 of the highest threshold voltage, the lowest level of the first pass voltage $V_{PASS1}$ is used, considering that the increase in the width of threshold voltage distribution according to the increasing number of an erase/program operation cycles is the smallest and a great amount of charges loses at the adjacent memory cells $MC_{n\pm1}$. As the read target memory cell $MC_n$ is programmed into a program state of a higher threshold voltage, the first pass voltage $V_{PASS1}$ is decreased. Despite the change in the first pass voltage $V_{PASS1}$, the second pass voltage $V_{PASS2}$ may be maintained at a uniform level. To help understanding, the first pass voltage $V_{PASS1}$ is exemplarily described below with reference to FIGS. 6A and 6B.

Figure 6A:
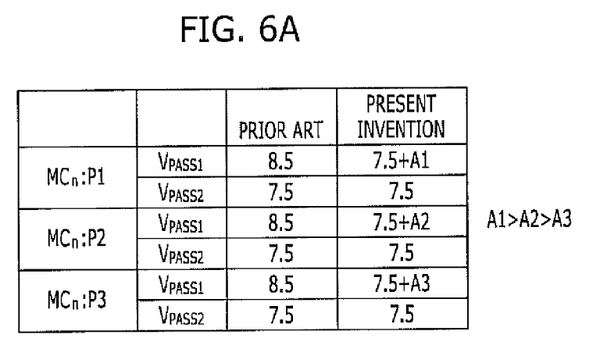
FIGS. 6A and 6B are tables exemplarily describing a first pass voltage.
Figure 6B:
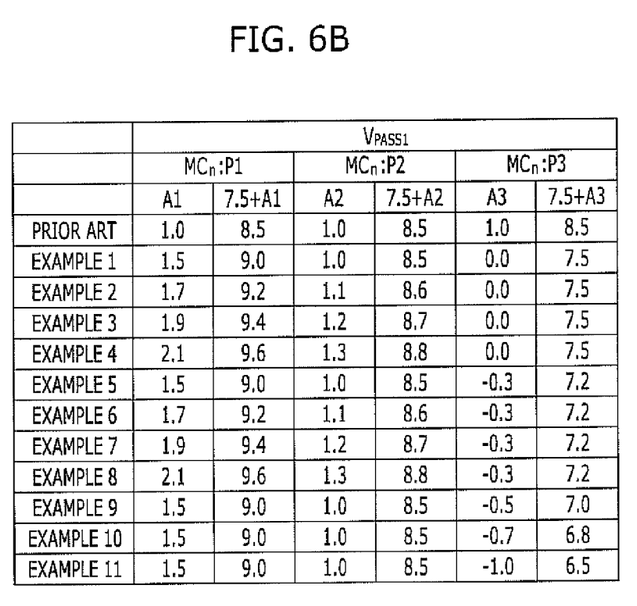

FIGS. 6A and 6B are tables exemplarily describing a first pass voltage.

Referring to FIG. 6A, a first pass voltage $V_{PASS1}$ of an uniform level, e.g., approximately 8.5V, is applied to the adjacent memory cells $MC_{n\pm1}$ regardless of the program state of the read target memory cell $MC_n$ according to the prior art. A second pass voltage $V_{PASS2}$, e.g., approximately 7.5V, which is lower than the first pass voltage $V_{PASS1}$, is applied to the other memory cells $MC_K$.

In this embodiment of the present invention, however, the level of the first pass voltage $V_{PASS1}$ applied to the adjacent memory cells $MC_{n\pm1}$ is controlled in consideration of the program state of the read target memory cell $MC_n$. For example, when the read target memory cell $MC_n$ is programmed into the first program state P1, the first pass voltage $V_{PASS1}$ is approximately 7.5V +A1, and when the read target memory cell $MC_n$ is programmed into the second program state P2, the first pass voltage $V_{PASS1}$ is approximately 7.5V +A2, and when the read target memory cell $MC_n$ is programmed into the third program state P3, the first pass voltage $V_{PASS1}$ is approximately 7.5V +A3, where A1>A2>A3(A1, A2 and A3 are positive voltages).

Referring to FIG. 6B, the specific values of the A1, A2 and A3 may be changed diversely on the premise that the relationship of A1>A2>A3 is achieved. This is presented as Examples 1 to 11 in the drawing, but there may be diverse examples other than the Examples 1 to 11 shown in the drawing. In particular, the Al may be higher than that of the prior art, and the A3 may be lower than that of the prior art, and the A3 may have a negative value. The A3 being a negative value means that the first pass voltage $V_{PASS1}$ may be lower than the second pass voltage $V_{PASS2}$. When the read target memory cell $MC_n$ is programmed into the first program state P1 of the lowest threshold voltage, the loss of charges is not a critical problem. Conversely, when the read target memory cell $MC_n$ is programmed into the third program state P3 of the highest threshold voltage, the increase in the threshold voltage distribution width is not a critical issue.

Referring back to FIG. 5, after the read voltage Vr, the first pass voltage $V_{PASS1}$ and the second pass voltage $V_{PASS2}$ are applied based on the above-described conditions in the step S503, whether the level of the selected bit line BLe is changed or not is recognized in step S505 to read the data stored in the read target memory cell $MC_n$.

Meanwhile, the first pass voltage $V_{PASS1}$ is controlled in consideration of the program state of the read target memory cell $MC_n$ in the above-described reading method, but the scope of the present invention is not limited to it. According to another embodiment of the present invention, the level of the first pass voltage $V_{PASS1}$ may be controlled in consideration of not only the program state of the read target memory cell $MC_n$ but also the number of the erase/program operation cycles. Herein, as the number of the erase/program operation cycles is increased, the variation of the threshold voltage distribution width and the loss amount of charges are deteriorated. This is described below with reference to FIGS. 7 and 8.

Figure 7:
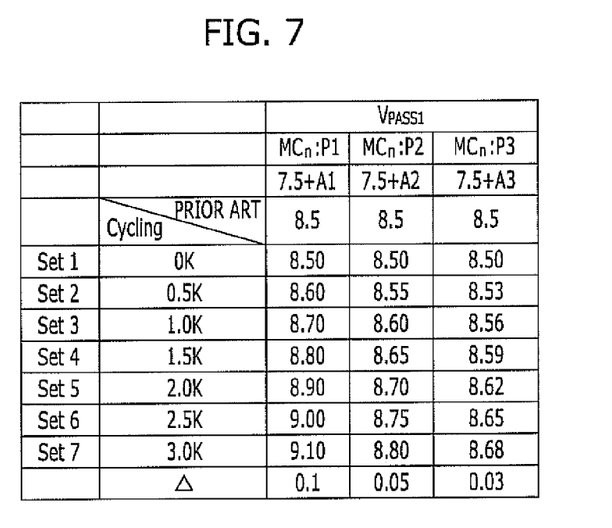
FIG. 7 is a table describing a first pass voltage in accordance with another embodiment of the present invention.

FIG. 7 is a table describing a first pass voltage in accordance with another embodiment of the present invention.

Referring to FIG. 7, when the number of the erase/program operation cycles is OK, there are little increase in the threshold voltage distribution width and little loss of charges. Therefore, a first pass voltage $V_{PASS1}$ of a uniform level, e.g., approximately 8.5V, may be used regardless of the program state of the read target memory cell $MC_n$ (refer to Set 1).

However, the increase in the threshold voltage distribution width becomes greater as the increasing number of the erase/program operation cycles. To prevent the threshold voltage distribution width from increasing, the level of the first pass voltage $V_{PASS1}$ is increased as it goes from Set 1 to Set 7. In short, the number of the cycling is divided into several durations, for example, 0 to 0.5K, 0.5 to 1.0K, 1.0 to 1.5K, 1.5 to 2.0K, 2.0 to 2.5K, 2.5 to 3.0K, and 3.0 and over, and the level of the first pass voltage $V_{PASS1}$ is increased by a predetermined extent as it goes to the next duration. The incremental extent of the first pass voltage $V_{PASS1}$ is denoted as $\Delta$. It is obvious to those skilled in the art that the number of the durations may be modified diversely more than 2.

As described above, when the read target memory cell $MC_n$ is programmed into the first program state P1, the increase of the threshold voltage distribution width is great while the loss of charges is small. Therefore, the incremental extent $\Delta$ of the first pass voltage $V_{PASS1}$ may be the greatest, e.g., approximately 0.1V. On the other hand, when the read target memory cell $MC_n$ is programmed into the third program state P3, the increase of the width of threshold voltage distribution is small while the charge loss is great. Therefore, the incremental extent $\Delta$ of the first pass voltage $V_{PASS1}$ may be the smallest, e.g., approximately 0.03V. It is obvious to those skilled in the art that specific values of the incremental extent $\Delta$ of the first pass voltage $V_{PASS1}$ may be diverse in each program state.

The level of the first pass voltage $V_{PASS1}$ is increased according to the number of cycling of the erase/program operation, but the incremental extent $\Delta$ of the first pass voltage $V_{PASS1}$ is made small as the read target memory cell $MC_n$ is programmed into a program state having a higher threshold voltage.

Figure 8:
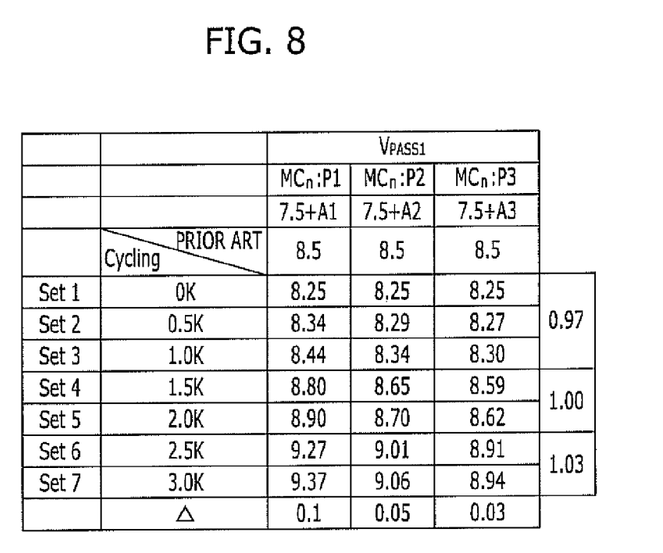
FIG. 8 is a table describing a first pass voltage in accordance with yet another embodiment of the present invention.

FIG. 8 is a table describing a first pass voltage in accordance with yet another embodiment of the present invention.

In the case shown in FIG. 7, the incremental extent $\Delta$ of the first pass voltage $V_{PASS1}$ is changed according to the program state, but the incremental extent $\Delta$ of the first pass voltage $V_{PASS1}$ is maintained at a uniform level in any one program state. However, when the number of the erase/program operation cycles is relatively small just as in the cases of Set 1 and Set 2, the increase in the threshold voltage distribution width and the loss of charges are not relatively great. On the other hand, when the number of the erase/program operation cycles is relatively great just as in the cases of Set 6 and Set 7, the increase in the threshold voltage distribution width and the loss of charges are great. In short, when the number of cycles of the erase/program operation is relatively great, the control of the first pass voltage $V_{PASS1}$ is more significant.

Therefore, referring to FIG. 8, when the number of the erase/program operation cycles is relatively small just as in the cases of Set 1 and Set 2, a low weight is given to the incremental extent $\Delta$ of the first pass voltage $V_{PASS1}$, e.g., approximately 0.97. In other words, the incremental extent $\Delta$ of the first pass voltage $V_{PASS1}$ is multiplied by 0.97 to the cases of Set 1 and Set 2. Conversely, when the number of the erase/program operation cycles is relatively great just as in the cases of Set 6 and Set 7, a high weight is given to the incremental extent $\Delta$ of the first pass voltage $V_{PASS1}$, e.g., approximately 1.03. In other words, the incremental extent $\Delta$ of the first pass voltage $V_{PASS1}$ is multiplied by 1.03 to the cases of Set 6 and Set 7. Herein, specific values of the weight may be changed diversely.

To sum up, while the level of the first pass voltage $V_{PASS1}$ is increased in consideration of the program state according to the number of cycling, the level of the first pass voltage $V_{PASS1}$ is not increased by a uniform incremental extent but increased with a weight to the incremental extent $\Delta$ of the first pass voltage $V_{PASS1}$ according to the number of the erase/program operation cycles is performed in such a manner that as the number of the cycling is small, the incremental extent $\Delta$ of the first pass voltage $V_{PASS1}$ is made small and as the number of the cycling is great, the incremental extent $\Delta$ of the first pass voltage $V_{PASS1}$ is made great.

According to an embodiment of the present invention, a reading method of a non-volatile memory device may improve the threshold voltage distribution width of a selected memory cell as well as preventing the loss of charges despite the increasing number of erase/program operation cycles.

While the present invention has been described with respect to the specific embodiments, it will be apparent to those skilled in the art that various changes and modifications may be made without departing from the spirit and scope of the invention as defined in the following claims.

What is claimed is:

1. A reading method of a non-volatile memory device, comprising:
    applying a read voltage to a gate of a selected memory cell;
    applying a first pass voltage to a gate of a memory cell adjacent to the selected memory cell: and
    applying a second pass voltage to gates of the other memory cells,
    wherein the selected memory cell is in a single program state of first to $T^{th}$ program states in a direction that threshold voltage is increased, where T is a natural number greater than 2, and
    the first pass voltage is decreased as the selected memory cell goes toward the $T^{th}$ program state,
    wherein when the selected memory cell is in one program state among the first to T-$1^{th}$ program states, the first pass voltage is higher than the second pass voltage; and
    when the selected memory cell is in the $T^{th}$ program state, the first pass voltage is lower than the second pass voltage.

2. The reading method of claim 1, wherein the second pass voltage is a fixed voltage.

3. The reading method of claim 1, wherein, as the number of erase/program operation cycles is increased, the first pass voltage is increased.

4. The reading method of claim 3, wherein an incremental extent of the first pass voltage is decreased as the selected memory cell goes toward the $T^{th}$ program state.

5. The reading method of claim 4, wherein, when the selected memory cell is in one program state, the incremental extent of the first pass voltage is a fixed voltage.

6. The reading method of claim 4, wherein when the selected memory cell is in one program state, the incremental extent of the first pass voltage is increased as the increasing number of the erase/program operation cycles.

* * * * *